United States Patent
Lee et al.

(10) Patent No.: US 10,044,469 B2
(45) Date of Patent: **\*Aug. 7, 2018**

(54) COMMUNICATION DEVICE AND COMMUNICATION METHOD

(71) Applicant: LSIS CO., LTD., Anyang-si, Gyeonggi-do (KR)

(72) Inventors: Sung Han Lee, Anyang-si (KR); Dae Hyun Kwon, Anyang-si (KR); Joon Seok Oh, Gunpo-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/382,518

(22) PCT Filed: Oct. 22, 2012

(86) PCT No.: PCT/KR2012/008651
§ 371 (c)(1),
(2) Date: Sep. 2, 2014

(87) PCT Pub. No.: WO2013/129750
PCT Pub. Date: Sep. 6, 2013

(65) Prior Publication Data
US 2015/0058707 A1     Feb. 26, 2015

Related U.S. Application Data

(60) Provisional application No. 61/605,764, filed on Mar. 2, 2012.

(51) Int. Cl.
| | | |
|---|---|---|
| H04L 1/00 | (2006.01) | |
| H03M 13/09 | (2006.01) | |
| H04L 29/06 | (2006.01) | |

(52) U.S. Cl.
CPC .......... H04L 1/0061 (2013.01); H03M 13/09 (2013.01); G06F 2212/403 (2013.01);
(Continued)

(58) Field of Classification Search
CPC ..... H04L 69/22; H04L 1/0075; H04L 1/0041; H04L 1/0045; H04L 1/0061; G06F 2212/403; H03M 13/09
(Continued)

(56) References Cited

U.S. PATENT DOCUMENTS 4,716,566 A * 12/1987 Masuhara ............. H03M 13/19
                                                     714/758
5,838,913 A * 11/1998 Lysejko .................. G06F 9/546
                                                     370/419
(Continued)

FOREIGN PATENT DOCUMENTS

| CN | 101621471 | 1/2010 |
|---|---|---|
| EP | 0237211 | 9/1987 |

(Continued)

OTHER PUBLICATIONS

PCT International Application No. PCT/KR2012/008651, Written Opinion of the International Searching Authority dated Feb. 25, 2013, 1 page.
(Continued)

*Primary Examiner* — April Y Blair
*Assistant Examiner* — Sazzad Hossain
(74) *Attorney, Agent, or Firm* — K&L Gates LLP

(57) ABSTRACT

A first communication device calculates a data error detection code for detecting an error in data by using the data and a virtual sequence number, and generates a packet comprising the data and the data error detection code. The packet does not include the virtual sequence number which is used for calculating error detection. The first communication device transmits the packet to a second communication device.

2 Claims, 5 Drawing Sheets

(52) U.S. Cl.
CPC .......... *H04L 1/0041* (2013.01); *H04L 1/0045* (2013.01); *H04L 1/0075* (2013.01); *H04L 69/22* (2013.01)

(58) Field of Classification Search
USPC .............. 370/473; 375/240.27; 714/758, 776
See application file for complete search history.

(56) References Cited

U.S. PATENT DOCUMENTS

| | | | | |
|---|---|---|---|---|
| 6,075,552 | A * | 6/2000 | Hasegawa | H04H 20/12 |
| | | | | 348/192 |
| 6,782,503 | B1 * | 8/2004 | Dawson | H04L 12/2697 |
| | | | | 714/739 |
| 7,433,370 | B1 * | 10/2008 | Tymes | H04W 28/06 |
| | | | | 370/474 |
| 2001/0022780 | A1 * | 9/2001 | Mizutani | H04M 3/42 |
| | | | | 370/261 |
| 2002/0067758 | A1 | 6/2002 | D'Amico | |
| 2004/0100984 | A1 * | 5/2004 | Nam | H04L 12/42 |
| | | | | 370/438 |
| 2006/0280204 | A1 * | 12/2006 | Nagata | H04L 1/1671 |
| | | | | 370/473 |
| 2008/0195912 | A1 | 8/2008 | Mende et al. | |
| 2009/0147676 | A1 * | 6/2009 | Shimonishi | H04L 1/1607 |
| | | | | 370/230 |
| 2009/0180476 | A1 * | 7/2009 | Lee | H04L 29/06027 |
| | | | | 370/392 |
| 2009/0307568 | A1 * | 12/2009 | Takaku | H04L 1/004 |
| | | | | 714/807 |
| 2009/0327826 | A1 * | 12/2009 | Inoue | H04L 1/1809 |
| | | | | 714/748 |
| 2010/0215042 | A1 * | 8/2010 | Sato | H04L 12/413 |
| | | | | 370/392 |
| 2012/0213526 | A1 * | 8/2012 | Tanaka | H04B 10/40 |
| | | | | 398/135 |
| 2013/0162190 | A1 * | 6/2013 | Smith | H02P 31/00 |
| | | | | 318/490 |

FOREIGN PATENT DOCUMENTS

| | | |
|---|---|---|
| EP | 0987918 | 11/2010 |
| JP | 2010-011296 | 1/2010 |
| KR | 10-2001-0018814 | 3/2001 |
| KR | 10-2010-0124650 | 11/2010 |
| WO | 99/49695 | 9/1999 |
| WO | 2011/042514 | 4/2011 |
| WO | 2012/009691 | 1/2012 |

OTHER PUBLICATIONS

European Patent Office Application Serial No. 12870208.1, Search Report dated Aug. 10, 2015, 10 pages.
Japan Patent Office Application Serial No. 2014-559810, Office Action dated Jul. 14, 2015, 3 pages.
Japan Patent Office Application Serial No. 2014-559810, Office Action dated Dec. 8, 2015, 2 pages.
China Patent Office Application No. 201280072754.7, Office Action dated Oct. 18, 2016, 6 pages.

* cited by examiner

COMMUNICATION DEVICE AND COMMUNICATION METHOD

CROSS-REFERENCE TO RELATED APPLICATIONS

This application is the National Stage filing under 35 U.S.C. 371 of International Application No. PCT/KR2012/008651, filed on Oct. 22, 2012, which claims the benefit of U.S. Provisional Application Ser. No. 61/605,764, filed on Mar. 2, 2012, the contents of which are all hereby incorporated by reference herein in their entirety.

TECHNICAL FIELD

The present disclosure relates to a communication device and a communication method, and more particularly, to a safety communication device and a safety communication method.

BACKGROUND ART

Solutions for safety communication to be used in industrial fields are currently sought. In particular, industrial control systems are required to maintain a prescribed or higher level of integrity of information transferred via a network in order to secure the safety of workers, avoid threats to environment and prevent the occurrence of safety-related problems.

In order to satisfy such integrity requirements, industrial control systems are required to treat problems about corruption, unintended repetition, incorrect sequence, loss, unacceptable delay, insertion, masquerade and addressing.

Regarding the problem of corruption, industrial control systems should be able to determine whether an error occurs in data being transferred, with a prescribed or higher level of probability.

Regarding the problem of unintended repetition, industrial control systems should be able to determine whether data repetition which is not maliciously intended by a person occurs normally, with a prescribed or higher level of probability.

Regarding the problem of incorrect sequence, industrial control systems should be able to determine whether a sequence of transmission of data is changed, with a prescribed or higher level of probability.

Regarding the problem of loss, industrial control systems should be able to determine whether a part of transmitted data is damaged, with a prescribed or higher level of probability.

Regarding the problem of unacceptable delay, industrial control systems should be able to determine whether an unacceptable delay occurs in transmission of data, with a prescribed or higher level of probability.

Regarding the problem of insertion, industrial control systems should be able to determine whether unintended data is inserted while transmitting data, with a prescribed or higher level of probability.

Regarding the problem of masquerade, industrial control systems should be able to determine whether data is changed maliciously by a person, with a prescribed or higher level of probability.

Regarding the problem of addressing, industrial control systems should be able to determine whether data is transmitted to a right receiver, with a prescribed or higher level of probability.

IEC 61508 represents a probability of error occurrence using SIL as shown in table 1 below.

TABLE 1

| SIL4 | $>=10^{-9}, <10^{-8}$ |
| SIL3 | $>=10^{-8}, <10^{-7}$ |
| SIL2 | $>=10^{-7}, <10^{-6}$ |
| SIL1 | $>=10^{-6}, <10^{-5}$ |

For example, to satisfy SIL3, the probability of error occurrence should satisfy $10^{-9}$.

However, it is difficult for current Ethernet frame structures to satisfy the integrity requirements of industrial control systems.

DISCLOSURE OF THE INVENTION

Technical Problem

Embodiments provide a communication device and a communication method satisfying the integrity requirements of industrial control systems.

Technical Solution

In one embodiment, a communication method for transmitting, by a first communication device, data to a second communication device includes: calculating, by the first communication device, a data error detection code for detecting an error of data using the data and a virtual sequence number; generating, by the first communication device, a packet including the data and the data error detection code; and transmitting, by the first communication device, the packet to the second communication device. The packet may not include a field for transmitting the virtual sequence number alone.

In another embodiment, a communication method for receiving, by a first communication device, data from a second communication device includes: receiving, by the first communication device, a packet from the second communication device; obtaining, by the first communication device, data and a received data error detection code from the packet; calculating, by the first communication device, a comparative data error detection code using a virtual sequence number and the data; and determining, by the first communication device, whether the packet has an error on the basis of the received data error detection code and the comparative data error detection code. The packet may not include a field for transmitting the virtual sequence number alone.

Advantageous Effects

According to the embodiments of the present disclosure, the integrity requirements of industrial control systems can be satisfied.

In particular, according to the embodiments of the present disclosure, errors such as unintended repetition, incorrect sequence, loss and insertion can be detected.

MODE FOR CARRYING OUT THE INVENTION

Hereinafter, a mobile terminal related to an embodiment will be described in detail with reference to the accompanying drawings. In the following description, the terms "module" and "unit" for referring to elements are assigned thereto and used exchangeably for convenience, and thus, the terms per se do not necessarily represent different meanings or functions.

Hereinafter, a safety communication device and a safety communication method according to embodiments will be described with reference to the accompanying drawings.

Figure 1:
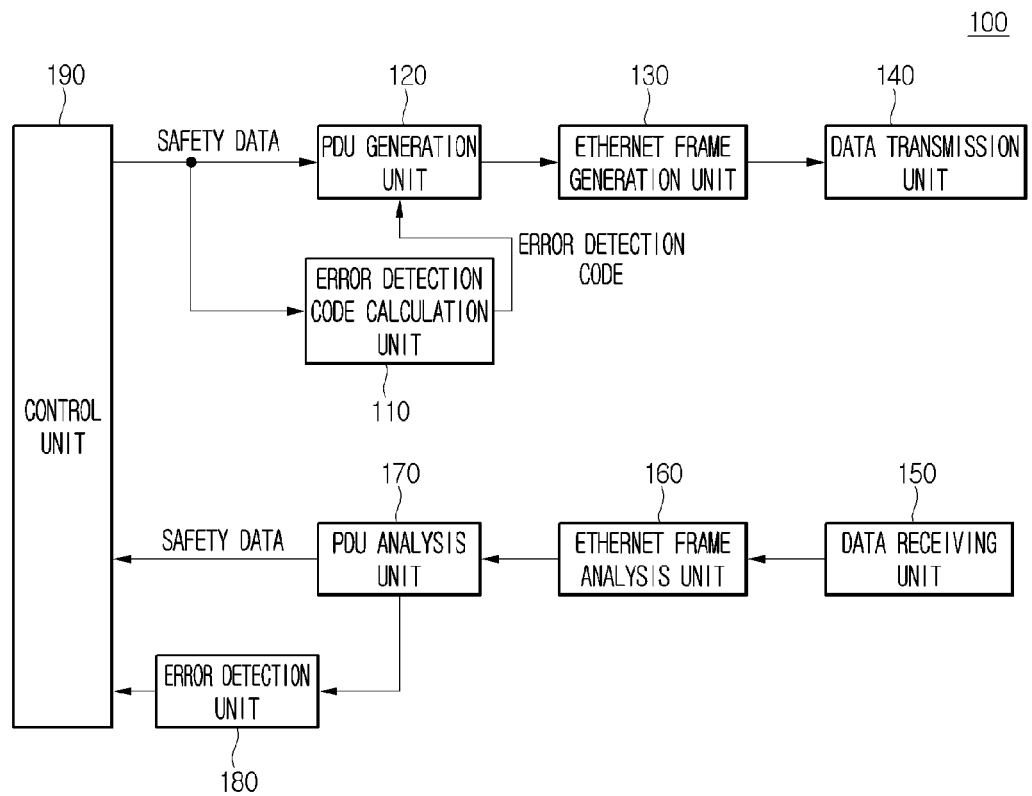
FIG. 1 is a block diagram illustrating a safety communication device according to an embodiment.

FIG. 1 is a block diagram illustrating a safety communication device according to an embodiment.

As illustrated in FIG. 1, a safety communication device 100 according to an embodiment includes an error detection code calculation unit 110, a protocol data unit (PDU) generation unit 120, an Ethernet frame generation unit 130, a data transmission unit 140, a data receiving unit 150, an Ethernet frame analysis unit 160, a protocol data unit analysis unit 170, an error detection unit 180, and a control unit 190.

The control unit 190 generates safety data, and provides the generated safety data to the error detection code calculation unit 110.

The error detection code calculation unit 110 calculates a data error detection code for the safety data using the safety data.

The protocol data unit generation unit 120 generates a safety protocol data unit including the calculated data error detection code and the generated safety data. Here, the safety protocol data unit may be referred to as a packet.

The Ethernet frame generation unit 130 generates an Ethernet frame including the generated safety protocol data unit.

The data transmission unit 140 transmits the generated Ethernet frame to another safety communication device. In this manner, the data transmission unit 140 transmits the generated safety protocol data unit to the other safety communication device.

The data receiving unit 150 receives the Ethernet frame including the safety protocol data unit from the other safety communication device.

The Ethernet frame analysis unit 160 analyzes the received Ethernet frame to obtain the safety protocol data unit.

The protocol data unit analysis unit 170 analyzes the protocol data unit to obtain the data error detection code and the safety data.

The error detection unit 180 calculates the data error detection code using the safety data, and then compares the calculated data error detection code with the obtained data error detection code to detect an error. In the case where the calculated data error detection code is equal to the obtained data error detection code, the error detection unit 180 determines that an error has not occurred in the safety data. On the contrary, in the case where the calculated data error detection code is different from the obtained data error detection code, the error detection unit 180 determines that an error has occurred in the safety data.

When it is determined that an error has occurred in the safety data, the control unit 190 changes an operation state of the safety communication device 100 into a fail-safe state. In the fail-safe state, the safety communication device 100 suspends safety communication until a user input for reset is received. In particular, in the fail-safe state, the safety communication device 100 may or may not suspend communication other than communication related to the safety data, but suspends at least the communication related to the safety data.

When it is determined that an error has not occurred in the safety data, the control unit 190 generates the safety data to be transmitted next. If the received safety data is related to a request, the control unit 190 generates the safety data related to a response. If the received safety data is related to a response, the control unit 190 generates the safety data related to a next request.

Figure 2:
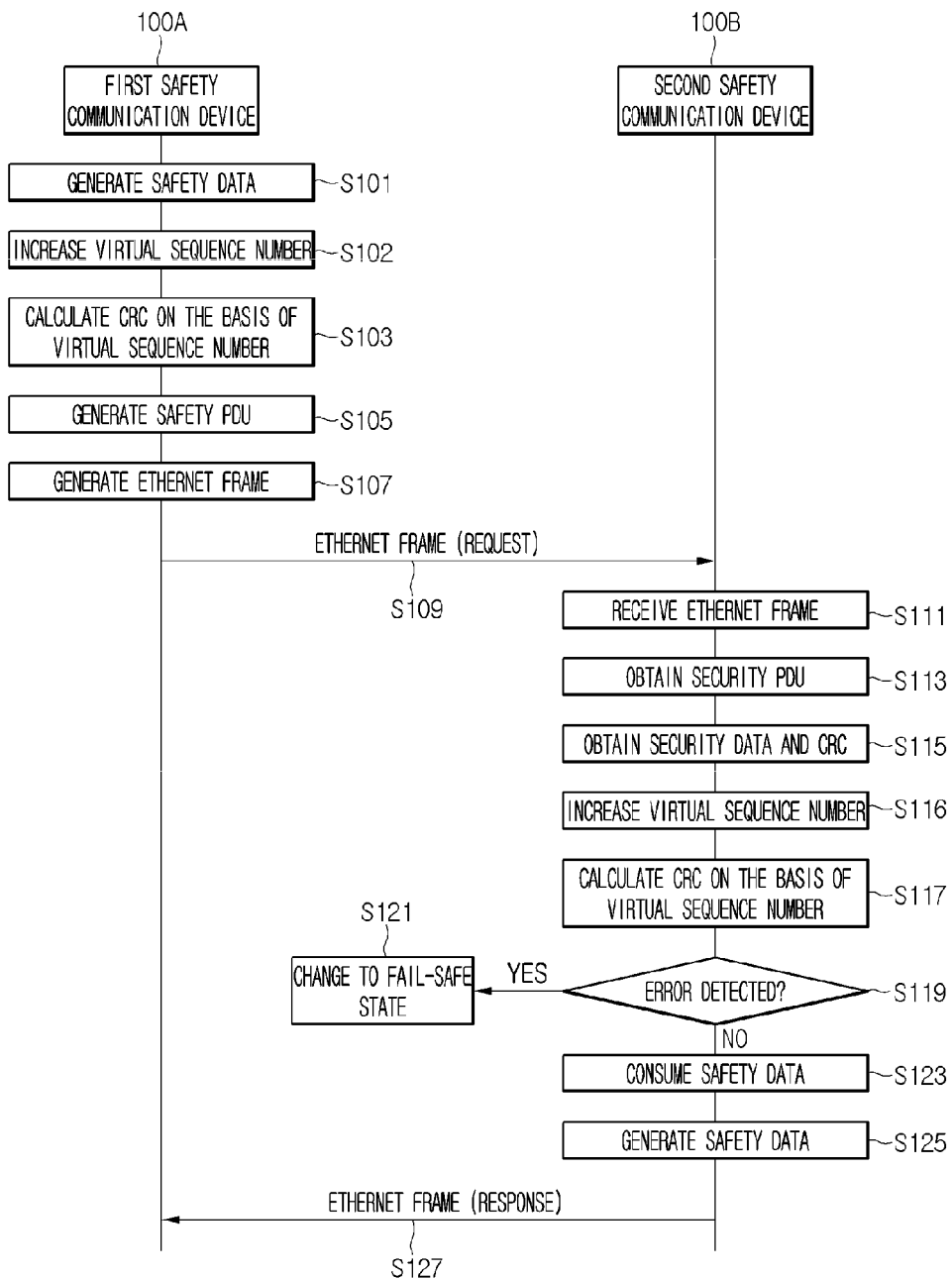
FIG. 2 is a ladder diagram illustrating a communication method according to an embodiment.

FIG. 2 is a ladder diagram illustrating a communication method according to an embodiment.

As illustrated in FIG. 2, it is assumed that a first safety communication device 100A communicates with a second communication device 100B, the first safety communication device 100A transmits a safety protocol data unit request to the second safety communication device 100B, and the second safety communication device 100B transmits a safety protocol data unit response to the first safety communication device 100A.

The control unit 190 of the first safety communication device 100A generates the safety data for a request (operation S101). The first safety communication device 100A may generate safety header data related to the request safety data together with the request safety data.

When the request safety data is generated, the error detection code calculation unit 110 of the first safety communication device 100A increases a virtual sequence number by one step (operation S102). Here, the one step may be 1 or a natural number greater than 1. The virtual sequence number indicates a sequence number of the safety protocol data unit to be generated later, and is not included in the safety protocol data unit. That is, the safety protocol data unit may not include a field for transmitting the virtual sequence number alone. When the first safety communication device 100A is reset, the error detection code calculation unit 110 of the first safety communication device 100A resets the virtual sequence number.

The error detection code calculation unit 110 of the first safety communication device 100A calculates the data error detection code for the safety data using the safety data and the virtual sequence number (operation S103). Here, the error detection code calculation unit 110 of the first safety communication device 100A may calculate a header error detection code for detecting an error of the safety header data using the safety data and the virtual sequence number. The error detection code may be a cyclic redundancy check (CRC) value.

In particular, as shown in Equation 1 below, the error detection code calculation unit 110 of the first safety communication device 100A may calculate the header error detection code HEADER_CRC using a header field, a unique identifier and the virtual sequence number. Here, the unique identifier may be a safety unique identifier (SUID).

$$\text{HEADER\_CRC} := f(\text{SUID}, \text{Virtual\_Sequence\_Number}, \text{Header\_field}) \quad \text{Equation 1}$$

In Equation 1, f denotes a hash function.

The safety unique identifier may represent a connection relationship between the first safety communication device 100A and the second safety communication device 100B. In particular, the safety unique identifier may be generated by combining a media access control (MAC) address, a source device identifier, a destination MAC address, and a destination device identifier. Since the first safety communication device 100A transmits the safety data and the second safety communication device 100B receives the safety data, the first safety communication device 100A is a source and the second safety communication device 100B is a destination. In this case, the safety unique identifier may be a combination of a MAC address of the first safety communication device 100A, a device identifier of the first safety communication device 100A, a MAC address of the second safety communication device 100B, and a device identifier of the second safety communication device 100B. The safety unique identifier may be used only for calculating the error detection code, without being included in the safety PDU.

The virtual sequence number may represent a sequence number of the safety PDU. The first safety communication device 100A uses the virtual sequence number to calculate the error detection code, but does not transmit the virtual sequence number to the second safety communication device 100B.

As shown in Equation 2 below, the error detection code calculation unit 110 of the first safety communication device 100A may calculate the data error detection code DATA_CRC using the safety data, the unique identifier and the virtual sequence number. Here, the unique identifier may be a safety unique identifier (SUID).

$$DATA\_CRC:=f(SUID, Virtual\_Sequence\_Number, Safety\_Data) \quad \text{Equation 2}$$

In Equation 2, f denotes a hash function.

The protocol data unit generation unit 120 of the first safety communication device 100A generates the safety protocol data unit including the safety data and the calculated data error detection code. Here, the safety protocol data unit may further include the safety header data and the calculated header error detection code. A structure of the safety protocol data unit according to an embodiment will be described with reference to FIG. 3.

Figure 3:
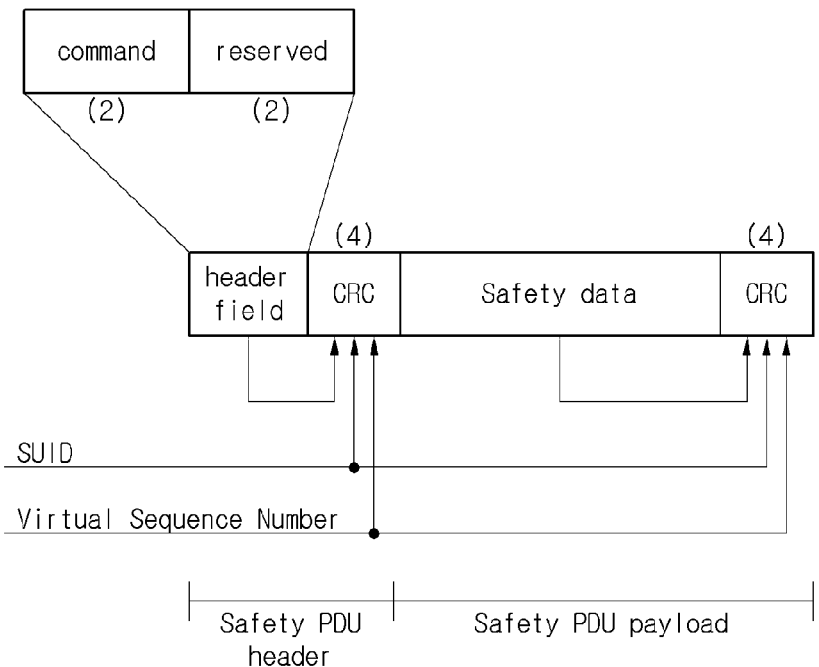
FIG. 3 illustrates a structure of a safety protocol data unit according to an embodiment.

FIG. 3 illustrates the structure of the safety protocol data unit according to an embodiment.

As illustrated in FIG. 3, the safety protocol data unit sequentially includes a safety PDU header and a safety PDU payload. The safety PDU header sequentially includes a safety header field and the header error detection code. The safety PDU payload sequentially includes the safety data and the data error detection code. In particular, the safety PDU header may be arranged at a forefront of the safety protocol data unit. The safety PDU header sequentially includes a command field and a reserved field. The safety data may be related to the safety PDU header. In particular, the safety data may be related to the command field. In particular, in the embodiment of FIG. 3, the safety header field has a size of 4 octets, the command field has a size of 2 octets, the reserved field has a size of 2 octets, the header error detection code has a size of 4 octets, and the data error detection code has a size of 4 octets; however, the sizes of the fields are not necessarily limited thereto. One octet generally represents 8 bits.

Table 2 shows examples of values of the command field according to an embodiment.

TABLE 2

| Command | Description |
| --- | --- |
| 0x01 | RESET |
| 0x02 | CONNECTION |

TABLE 2-continued

| Command | Description |
| --- | --- |
| 0x03 | PARAMETER |
| 0x04 | DATA |

As shown in Table 2, if the value of the command field is 0x01, the safety data may represent a reset command. If the value of the command field is 0x02, the safety data may represent a connection command. If the value of the command field is 0x03, the safety data may represent a parameter transmission command. If the value of the command field is 0x04, the safety data may represent a data transmission command.

In particular, the embodiment of FIG. 2 may correspond to a communication method in a connection state in which the command field has the value corresponding to the connection command. In the connection state, the first safety communication device 100A may correspond to an initiator, and the second safety communication device 100B may correspond to a responder. The initiator is in a mode in which the request safety data is transmitted to the responder but response safety data is not transmitted. The responder is in a mode in which the response safety data is transmitted to the initiator but the request safety data is not transmitted.

The reserved field may be used later for other purposes.

As illustrated in FIG. 3, the safety protocol data unit may not include the virtual sequence number. That is, the safety protocol data unit may not include a field for transmitting the virtual sequence number alone.

FIG. 2 will be described again.

The Ethernet frame generation unit 130 of the first safety communication device 100A generates an Ethernet frame including the request safety data (operation S107). Here, the Ethernet frame may include the generated safety protocol data unit. A structure of the Ethernet frame according to an embodiment will be described with reference to FIG. 4.

Figure 4:
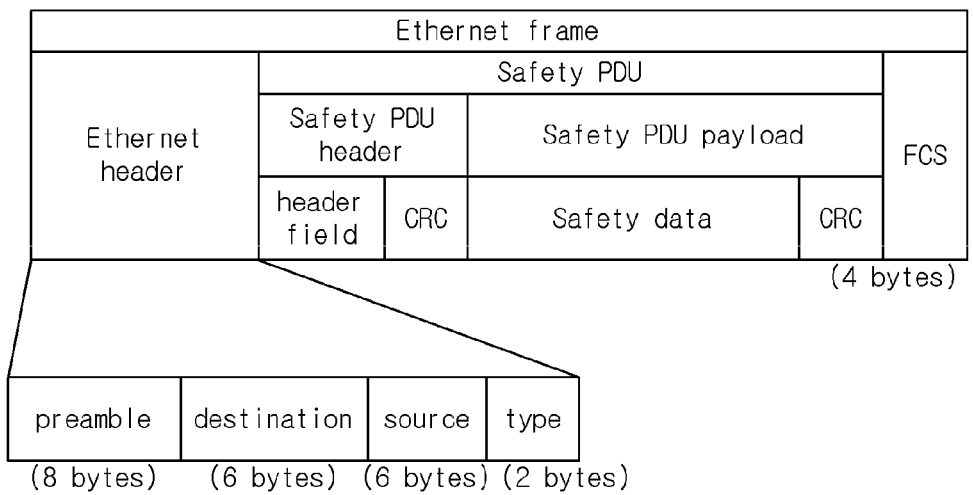
FIG. 4 illustrates a structure of an Ethernet frame according to an embodiment.

FIG. 4 illustrates the structure of the Ethernet frame according to an embodiment.

As illustrated in FIG. 4, the Ethernet frame sequentially includes an Ethernet header, an Ethernet payload, and a frame check sequence (FCS). The Ethernet frame includes the safety PDU as the payload. The Ethernet frame header includes a preamble field, a destination address field, a source address field, and a type field. The destination address field contains an address of a safety communication device corresponding to a destination, and the source address field contains an address of a safety communication device corresponding to a source. The frame check sequence may be generated using data within the Ethernet header and data within the payload.

FIG. 2 will be described again.

The data transmission unit 140 of the first safety communication device 100A transmits the Ethernet frame including the request safety data to the second safety communication device 100B (operation S109). In this manner, the data transmission unit 140 may transmit the generated safety protocol data unit to the second safety communication device 100B.

The data receiving unit 150 of the second safety communication device 100B receives, from the first safety communication device 100A, the Ethernet frame including the safety protocol data unit related to a request (operation S111). Here, the Ethernet frame may have the structure as illustrated in FIG. 4.

The Ethernet frame analysis unit 160 of the second safety communication device 100B analyzes the received Ethernet frame to obtain the safety protocol data unit (operation S113). Here, the safety protocol data unit may have the structure as illustrated in FIG. 3.

The protocol data unit analysis unit 170 of the second safety communication device 100B analyzes the protocol data unit to obtain the safety header data, a received header error detection code, the request safety data, and a received data error detection code (operation S115).

When the safety protocol unit is received and the request safety data is obtained, the error detection unit 180 of the second safety communication device 100B increases the virtual sequence number managed thereby by one step (operation S116). As mentioned above, the one step may be 1 or a natural number greater than 1.

The error detection unit 180 of the second safety communication device 100B calculates a comparative data error detection code using the request safety data and the increased virtual sequence number (operation S117). In addition, the error detection unit 180 of the second safety communication device 100B may calculate a comparative header error detection code using the safety header data and the increased virtual sequence number.

In particular, the error detection unit 180 of the second safety communication device 100B may calculate the comparative header error detection code using Equation 1.

Furthermore, the error detection unit 180 of the second safety communication device 100B may calculate the comparative data error detection code using Equation 2.

The error detection unit 180 of the second safety communication device 100B compares a calculated error detection code and an obtained error detection code to detect an error (operation S119). In the case where the comparative data error detection code is equal to the received data error detection code and the comparative header error detection code is equal to the received header error detection code, the error detection unit 180 may determine that an error has not occurred in the safety data. On the contrary, in the case where the comparative data error detection code is different from the received data error detection code or the comparative header error detection code is different from the received header error detection code, the error detection unit 180 may determine that an error has occurred in the safety data.

When it is determined that an error has occurred in the safety data, the control unit 190 of the second safety communication device 100B changes the operation state of the safety communication device 100 into the fail-safe state (operation S121). In the fail-safe state, the safety communication device 100 suspends the safety communication until the user input for reset is received. In particular, in the fail-safe state, the safety communication device 100 may or may not suspend communication other than the communication related to the safety data, but suspends at least the communication related to the safety data.

When it is determined that an error has not occurred in the safety data, the control unit 190 of the second safety communication device 100B consumes the received request safety data (operation S123), and generates the response safety data to be transmitted next (operation S125).

The error detection code calculation unit 110, the protocol data unit generation unit 120, the Ethernet frame generation unit 130, and the data transmission unit 140 of the second safety communication device 100B generate the Ethernet frame including the response safety PDU including the response safety data, as described above with respect to operations S101 to S109, and then transmit the Ethernet frame to the first safety communication device 100A (operation S127). In one embodiment, the virtual sequence number may be increased when the request safety data is transmitted, and the virtual sequence number may be increased when the response safety data is transmitted. In another embodiment, the virtual sequence number may be increased when the request safety data is transmitted, but the virtual sequence number may not be changed when the response safety data is transmitted.

The data receiving unit 150, the Ethernet frame analysis unit 160, the protocol data unit analysis unit 170, the error detection unit 180, and the control unit 190 of the first safety communication device 100A receive the Ethernet frame including the response safety PDU, perform error detection and consume response safety data as described above with respect to operations S111 to S123. In one embodiment, the virtual sequence number may be increased when the request safety data is received, and the virtual sequence number may be increased when the response safety data is received. In another embodiment, the virtual sequence number may be increased when the request safety data is received, but the virtual sequence number may not be changed when the response safety data is received.

Figure 5:
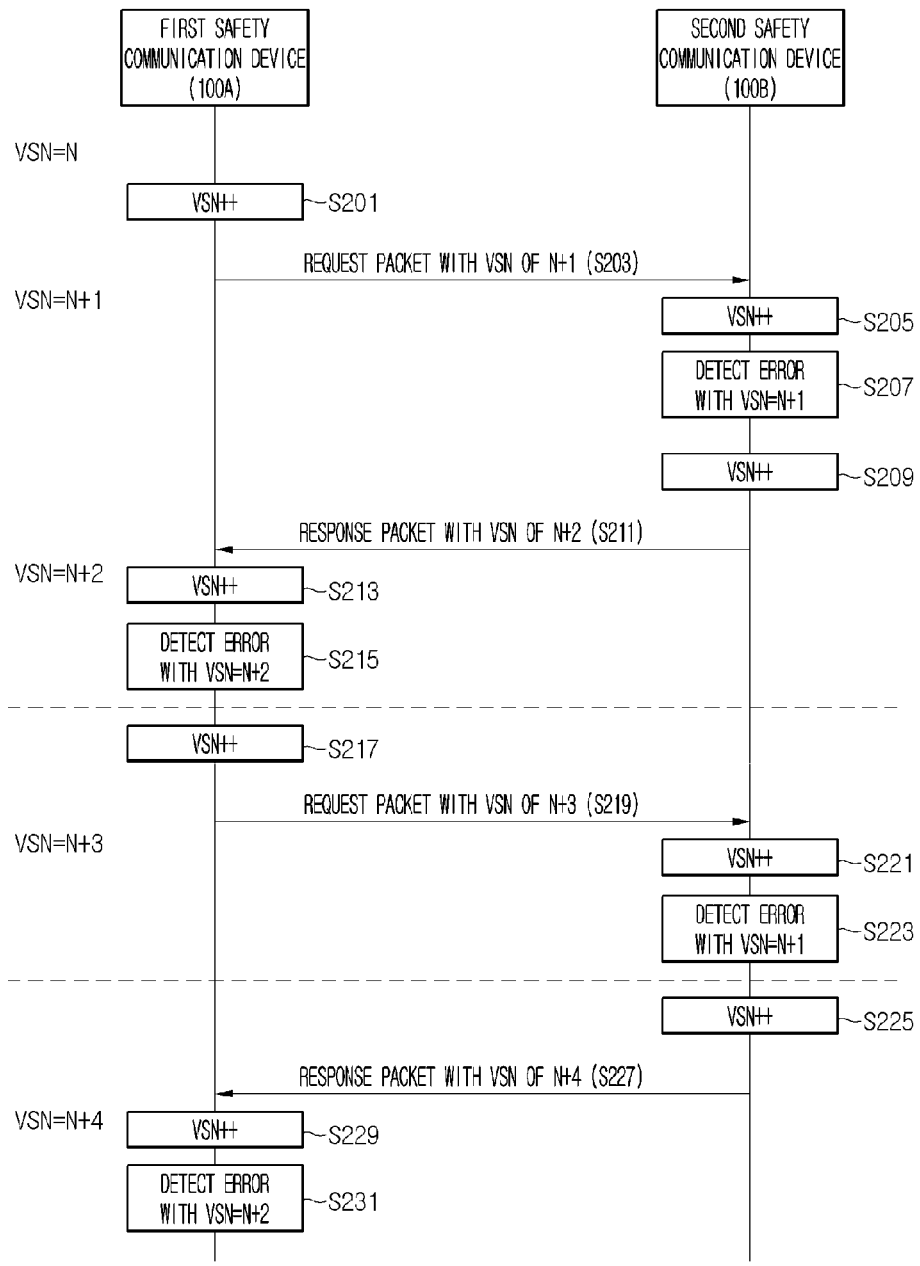
FIG. 5 is a ladder diagram illustrating a communication method related to a virtual sequence number according to an embodiment.

FIG. 5 is a ladder diagram illustrating a communication method related to the virtual sequence number according to an embodiment.

Firstly, it is assumed that the virtual sequence numbers managed by the first and second safety communication devices 100A and 100B have a value of N.

When the request safety data is generated, the first safety communication device 100A increases the virtual sequence number N by 1 in order to transmit a packet including the request safety data (operation S201).

The first safety communication device 100A generates the CRC value using the increased virtual sequence number N+1, and transmits a request safety packet including the generated CRC and the request safety data to the second safety communication device 100B (operation S203). That is, the virtual sequence number for this request safety packet is N+1.

Upon receiving the request safety packet including the request safety data, the second safety communication device 100B increases the virtual sequence number N by 1 (operation S205).

The second safety communication device 100B checks whether the request safety packet has an error using the increased virtual sequence number N+1 (operation S207).

Thereafter, when the response safety data is generated, the second safety communication device 100B increases the virtual sequence number N+1 by 1 in order to transmit a response safety packet including the response safety data (operation S209).

The second safety communication device 100B generates the CRC value using the increased virtual sequence number N+2, and transmits a response packet including the generated CRC and the response safety data to the first safety communication device 100A (operation S211). That is, the virtual sequence number for this response safety packet is N+2.

Upon receiving the response safety packet, the first safety communication device 100A increases the virtual sequence number N+1 by 1 (operation S213).

The first safety communication device 100A checks whether the response safety packet has an error using the increased virtual sequence number N+2 (operation S215).

Operations S217 to S231 are repetition of operations S201 to S215.

Figure 6:
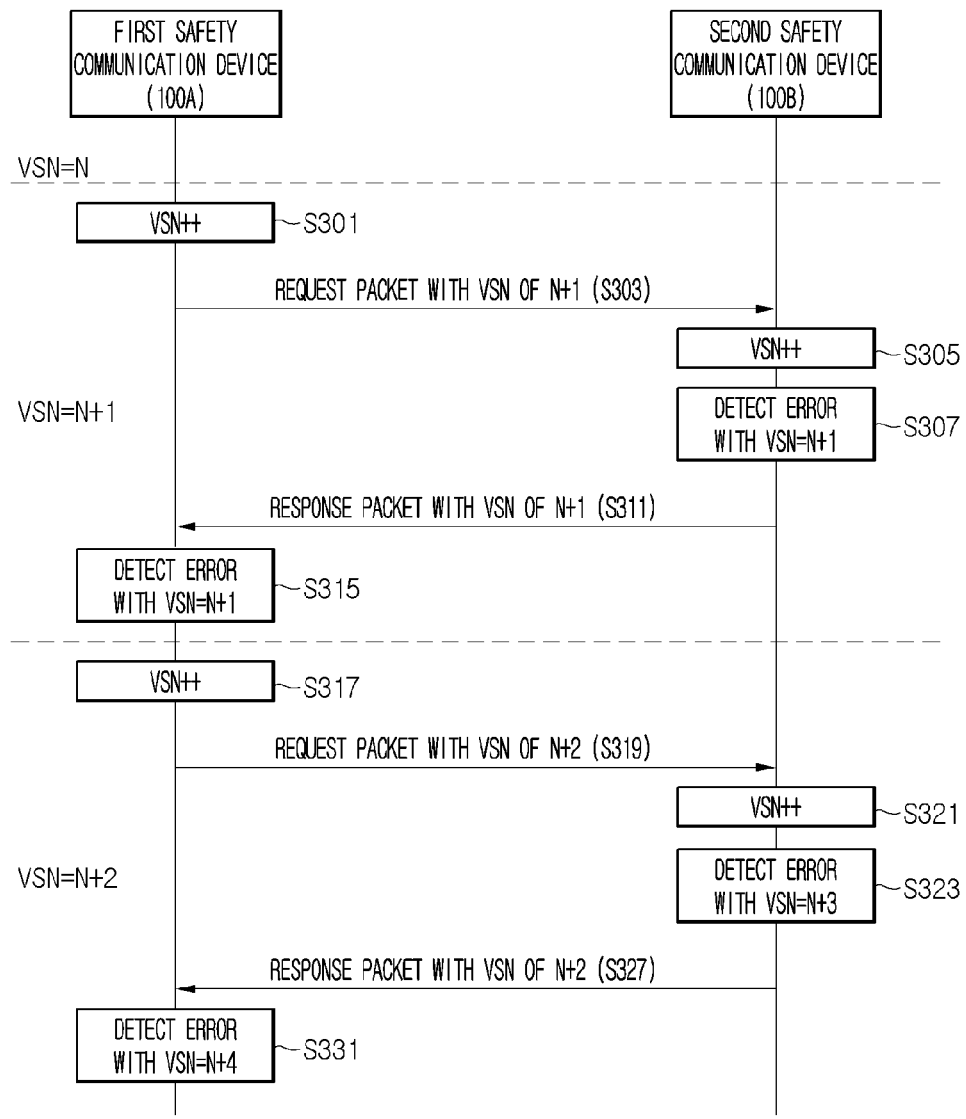
FIG. 6 is a ladder diagram illustrating a communication method related to the virtual sequence number according to another embodiment.

FIG. 6 is a ladder diagram illustrating a communication method related to the virtual sequence number according to another embodiment.

Firstly, it is assumed that the virtual sequence numbers managed by the first and second safety communication devices 100A and 100B have a value of N.

When the request safety data is generated, the first safety communication device 100A increases the virtual sequence number N by 1 in order to transmit a packet including the request safety data (operation S301).

The first safety communication device 100A generates the CRC value using the increased virtual sequence number N+1, and transmits the request safety packet including the generated CRC and the request safety data to the second safety communication device 100B (operation S303). That is, the virtual sequence number for this request safety packet is N+1.

Upon receiving the request safety packet including the request safety data, the second safety communication device 100B increases the virtual sequence number N by 1 (operation S305).

The second safety communication device 100B checks whether the request safety packet has an error using the increased virtual sequence number N+1 (operation S307).

Thereafter, even though the response safety data is generated, the second safety communication device 100B maintains the virtual sequence number N+1 managed to transmit the response safety packet including the response safety data.

The second safety communication device 100B generates the CRC value using the current virtual sequence number N+1, and transmits the response packet including the generated CRC and the response safety data to the first safety communication device 100A (operation S311). That is, the virtual sequence number for this response safety packet is N+1. Upon receiving the response safety packet, the first safety communication device 100A maintains the virtual sequence number N+1.

The first safety communication device 100A checks whether the response safety packet has an error using the current virtual sequence number N+1 (operation S315).

Operations S317 to S331 are repetition of operations S301 to S315.

According to an embodiment, the above-mentioned methods may be implemented with processor-readable codes in a program-recorded medium. A processor-readable recording medium includes, for example, a ROM, a RAM, a CD-ROM, a magnetic tape, a floppy disk, and an optical data storage device, and may also be implemented in the form of a carrier wave (for example, transmission via the Internet).

The above-mentioned mobile terminals are not limited to the configuration and methods of the above-mentioned embodiments. The entirety or part of each embodiment may be selectively combined with each other to make various medications.

The invention claimed is:

1. A safety communication method for receiving, by a first communication device, data from a second communication device, the method performed or controlled by one or more hardware controllers and comprising:

generating, by the second communication device, safety data, wherein the first communication device and the second communication device have a virtual sequence number;

receiving, by a data receiving unit of the first communication device, a packet from the second communication device;

obtaining, by a protocol data unit analysis unit of the first communication device, the safety data, a first data error detection code, and a first header error detection code from the packet, wherein the first data error detection code is calculated by an error detection code calculation unit of the second communication device using a safety unique identifier (SUID) that represents a connection relationship between the first communication device and the second communication device and the safety data, and wherein the first header error detection code is calculated by the error detection code calculation unit of the second communication device using a header field and the SUID;

calculating, by an error detection unit of the first communication device, a second data error detection code;

calculating, by the error detection unit of the first communication device, a second header error detection code, wherein the SUID is generated by combining a source media access control (MAC) address and a source device identifier corresponding to the first communication device, and a destination MAC address and a destination device identifier corresponding to the second communication device;

comparing, by the error detection unit of the first communication device, the second data error detection code with the first data error detection code;

comparing, by the error detection unit of the first communication device, the first header error detection code with the second header error detection code;

determining, by the error detection unit of the first communication device, that no error has occurred in the safety data if the second data error detection code is equal to the first data error detection code and the first header error detection code is equal to the second header error detection code;

determining, by the error detection unit of the first communication device, that an error has occurred in the safety data if the second data error detection code is different from the first data error detection code or if the first header error detection code is different from the second header error detection code;

changing, by the first communication device, an operation state of the first communication device to a state in which safety communication is suspended until a user input for resetting the suspended safety communication is received when the error has occurred in the safety data, wherein communication other than the safety communication related to the safety data is not suspended when the safety communication is suspended, wherein the second communication device increases the virtual sequence number when the safety data is request data and when the request data is generated, wherein the first data error detection code and the first header error detection code are also calculated using the increased virtual sequence number, wherein the first communication device increases the virtual sequence number when the safety data is request data and when the request data is received, wherein the calculating the second data error detection code comprises calculating the second data error detection code using the request data, the SUID, and the increased virtual sequence number, wherein the calculating the second header error detection code comprises calculating the second header error detection code using the header field, the SUID, and the increased virtual sequence number, wherein the second communication device increases the virtual sequence number or not changing the virtual sequence number when the safety data is response data and when the response data is generated, wherein the calculating the second data error detection code comprises calculating the second data error detection code using the response data, the SUID, and the increased virtual sequence number.

2. The method according to claim 1, wherein the packet does not comprise a field for transmitting the virtual sequence number alone.

* * * * *